United States Patent

[11] 3,611,383

[72] Inventor Meyer Bar
Palos Verdes Penninsula, Calif.

[21] Appl. No. 855,810
[22] Filed Sept. 8, 1969
[45] Patented Oct. 5, 1971
[73] Assignee Guidance Technology Inc.
Santa Monica, Calif.

[54] INSTANTANEOUS PREDICTIVE AUTOMATIC GAIN CONTROL CIRCUIT USEFUL IN LORAN NAVIGATION
13 Claims, 2 Drawing Figs.

[52] U.S. Cl. .......................................... 343/103,
325/404, 325/405, 325/410
[51] Int. Cl. .......................................... G01s 1/24,
H03g 3/20
[50] Field of Search .......................................... 343/103;
325/404, 405, 410

[56] References Cited
UNITED STATES PATENTS
3,034,119 5/1962 Durbin et al. .................. 343/103

*Primary Examiner*—T. H. Tubbesing
*Attorney*—Robert E. Geauque

ABSTRACT: An automatic gain control circuit used in the receiver of a Loran navigational system is described which has a first channel comprising a delay line and a plurality of amplifiers and a second channel comprising an automatic gain control loop which includes a predictor circuit. In the automatic gain control loop, the signals are amplified, detected, and differentiated. The differentiator anticipates the signals' rate of growth. Growth rate is then translated to the automatic gain control level which is applied to the RF and IF amplifiers in the receiver circuit. When the signal emerges from the delay line, the automatic gain control level presents a static level to the appropriate amplifier stage.

INVENTOR.
MEYER BAR,
BY R. E. Beaugue
ATTORNEY.

INSTANTANEOUS PREDICTIVE AUTOMATIC GAIN CONTROL CIRCUIT USEFUL IN LORAN NAVIGATION

BACKGROUND OF THE INVENTION

1. Field of the Invention

This invention relates to navigational systems and more particularly to the novel and improved instantaneous predictor used in an automatic gain control system for a loran receiver or the like.

2. Discussion of the Prior Art

Loran receivers are well known to those skilled in the art. Such a system may be found in U.S. Let. Pat. No. 3,422,433. In this patent there is described the navigational control system using master- and slave-snychronized radio pulses from pairs of transmitting stations at known spaced-apart locations. When given the velocity of the radio wave propagation, the difference in arrival time can be converted to a difference in distance from the two known transmitting locations. The difference in distance determines a hyperbolic line of position along which the craft must be located. Loran automatic gain control systems have a unique requirement that make them different in operation from most prior art automatic gain controls used in present day communication systems. In these prior art systems the receiver is continually tuned to one station, and therefore an automatic gain control level can be established during the first few microseconds after turn-on. Once the level is established, the fluctuation in signal strength is finer and the receiver may automatically and readily track the automatic gain control.

Loran receiver usages require that they be tuned to two different transmitting stations at the same time. The two stations alternate their transmissions and hence the receiver receives first one station's signal and then the other's on a continuing and alternating basis. Since the signal strength from the two stations differs and a difference in strength changes randomly, a complex automatic gain control system is required.

An additional complexity in instantaneous loran automatic gain control is that the modulation must not be affected by the automatic gain control process. The problem in the prior art systems has been that if the pulse itself causes its own automatic gain control, it acts upon itself and hence causes self-distortion. This distortion cannot be tolerated due to the precision requirements of the loran receiving system.

SUMMARY OF THE INVENTION

Because of the fact that the loran pulse acting upon itself (for automatic gain control) distorts itself, means and apparatus are provided using memoryless prediction. The prediction must be based upon the magnitude of the pulse to be evaluated. The evaluation must be completed in the automatic gain control level set just prior to the pulse entry into the circuitry. These conditions may be met by using a combination of a delay line and a predictor.

To implement the above predictor circuit, the loran signal is first passed to a low-gain RF amplifier. This amplifier insures proper pass band characteristics and sufficient power to low-level signals. Thereafter the signal is split. One part of the signal enters a delay line and the other part enters the automatic gain control circuit. In the automatic gain control loop the signal is amplified, detected, and differentiated.

The differentiator anticipates the signal's rate of growth. This growth rate is then translated to an automatic gain control level which is applied to the RF and IF amplifiers in the receiver. These amplifiers receive the automatic gain control bias level and stabilize prior to the loran signal's emergence from the delay line. When the signal does emerge from the delay line, the automatic gain control level presents a static level which does not cause a distortion. This technique allows each pulse to set its own level without causing self-distortion.

DESCRIPTION OF THE DRAWINGS

These and other features and advantages will become more apparent to those skilled in the art when taken into consideration with the following detailed description wherein like reference numerals indicate like and corresponding parts throughout the several views, and wherein.

DESCRIPTION OF A PREFERRED EMBODIMENT

Figure 1:
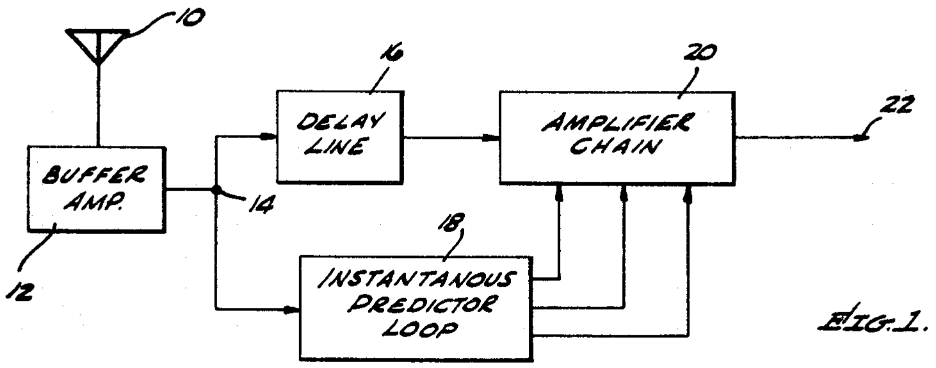
FIG. 1 is a block diagram of the receiver of this invention.

Turning now to FIG. 1, there is shown an antenna 10 which receives loran pulses from distant stations. The antenna is coupled into a buffer amplifier 12. The amplifier 12 leads to a junction 14. Thereafter the amplifier is coupled into a delay line 16 and into an instantaneous predictor loop 18. The delay line 16 delays the signal for a predetermined time and applies it to the amplifier chain 20. The delay of the loran pulse is generally sufficient to allow the predictor loop 18 to evaluate the pulse and modify the amplifier chain 20. The predictor loop 18 then sets the amplifiers 20 to modify the loran pulse as it emerges from the delay line 16 and provides the modified automatic gain-controlled output on an output lead 22. The lead 22 then couples the modified loran pulse into computing apparatus which performs certain functions for navigational purposes as set forth in U.S. Pat. No. 3,422,433 aforesaid.

Figure 2:
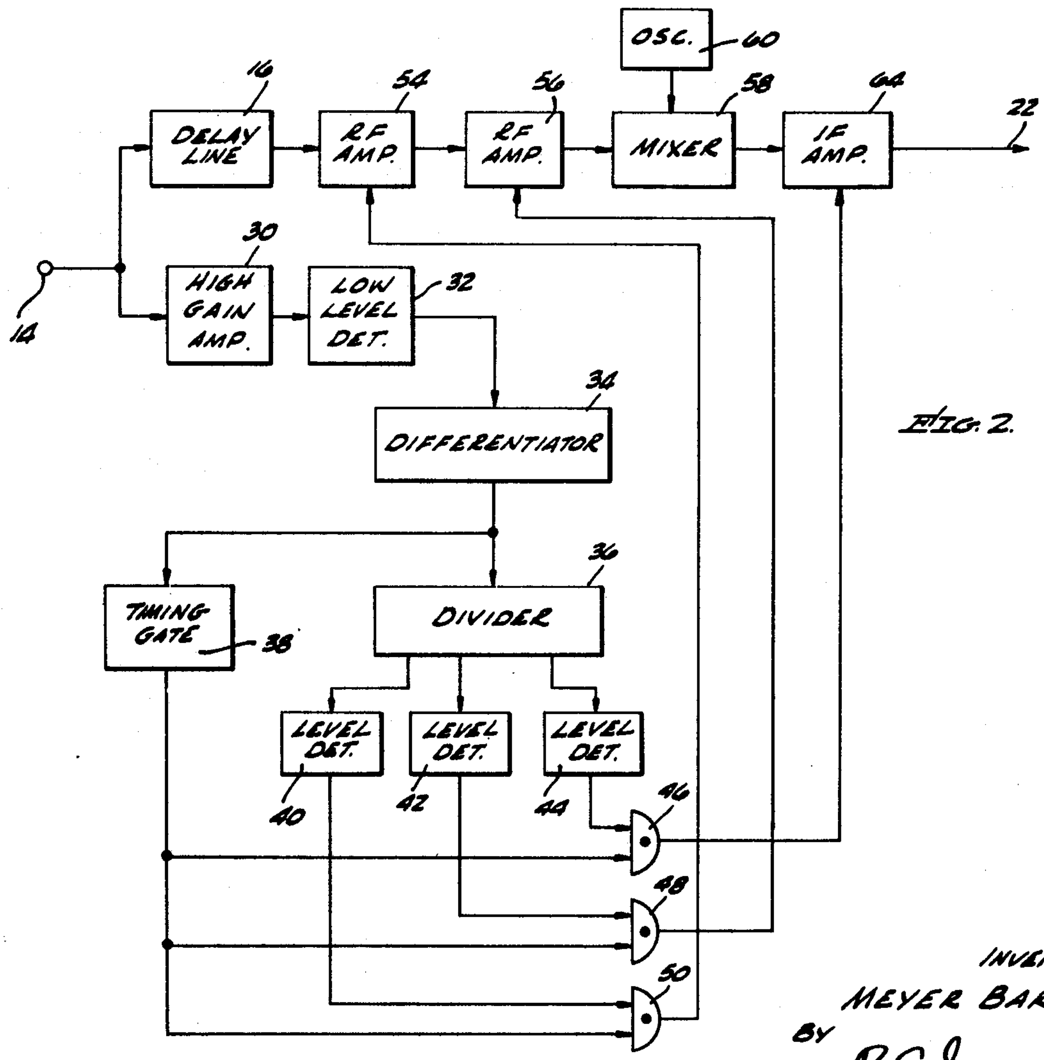
FIG. 2 is a more detailed block diagram of the instantaneous predictor loop used in the receiver shown in FIG. 1.

Referring now to FIG. 2, the output from junction 14 which is coupled into the instantaneous predictor loop 18 is first applied to a high-gain amplifier 30. The loran pulse is then applied to a low-level detector 32. The low-level detector 32 ensures that the loran pulse is detected early in its amplitude rise and starts the system detecting at a very low level. The output of the low-level detector 32 is applied into a differentiator 34 which differentiates the signal early in the amplitude rise time. By differentiating the initial pulse in differentiator 34, an indication is made as to how fast the pulse is growing per unit time. Since all loran pulses are identically shaped the rate of growth in the first fractional second is predictive of the ultimate amplitude the pulse will achieve. A determination of the rate of growth in the first fractional second is achieved by voltage divider 36, timing gate 38, and level detectors 40, 42, and 44. Timing gate 38 measures the initial fractional second during which the growth rate is measured.

The input voltage to divider 36 may be at a number of different voltage levels. The divider 36 provides outputs to the level detectors 40, 42, and 44 only when the level on the input to the divider 36 is above a certain threshold level. For example, when the input to divider 36 is 50 millivolts, an output is provided to the level detector 40. When the input is 150 millivolts, an output is provided to both level detectors 40 and 44. Finally when the signal level to divider 36 is 250 millivolts, an output is provided to level detectors 40, 42, and 44.

Each level detector 40, 42, and 44 is adapted to detect signals at a predetermined level. For example, in the embodiment set forth the level detectors are set at a threshold which is above the noise level. This embodiment has the levels set at 50 millivolts. The level detectors 40, 42, and 44 are coupled to gates 50, 48, and 46, respectively. The output of the timing gate 38 is also applied into each of these particular gates. Whenever a signal is applied to a gate from its respective level detector and the timing gate 38, that gate is enabled.

The timing gate may, for example, be a comparator gate which initiates the gates 46, 48, and 50 directly at emergence of the signal from the differentiator.

The gates 46, 48, and 50 are coupled into the amplifier chain 20, as shown in FIG. 1. With reference to FIG. 2, the output of gate 50 is applied into an RF amplifier 54 which is coupled in series with the delay line 16 to receive the loran signal therefrom. The loran pulse is amplified in RF amplifier 54 and further modified by a signal from the gate 50 whereby the signal from the gate 50 provides the bias lead to amplifier 54. The modified pulse from the RF amplifier 54 is then applied to a second RF amplifier 56. In the amplifier 56 the signal is modified by the output of the gate 48 whereby the signal from gate 48 supplies a modification signal to the bias signal to the amplifier. Next, the received pulse from RF amplifier 56 is beat down in the mixer 58 to an IF signal by the oscillator 60. Such a process of changing the frequency of a signal is well known to those skilled in the art. The output of the mixer 58 is coupled to an IF amplifier 64 where the loran pulse is modified by signals from the low-level detector 44 through gate 46.

Thus, divider 36 provides signals to the level detectors 40, 42, and 44 which are triggered into their ON state when the inputs thereto exceed a predetermined level. The level detectors achieve their predetermined trigger level from the divider 36. Thereafter the respective gates 46, 48, and 50 are enabled. It should be understood that any combination of gates, either 46, 46 and 48, and 46, 48 and 50, may be enabled at the same time to control very strong signals.

Each time the signal from delay line 16 enters a respective amplifier 54, 56, and 64, the automatic gain control level has already been established therein, just prior to its arrival. Hence, upon receipt of the loran pulse the amplifiers are set to the proper bias level by the predictor loop 18.

Having thus described but one preferred embodiment of this invention, what is claimed is:

1. A loran receiver having an input circuit responsive to the received signals and an output circuit for providing an output signal, said receiver including:

a delay means coupled to said input circuit;

a plurality of amplifier stages being coupled in series and responsive to said delay means;

a divider circuit, having an input coupled to said input circuit and having a plurality of output means; and means for gating said output means to corresponding ones of said plurality of amplifiers.

2. The receiver as defined in claim 1 and further including a timing circuit coupled to said input circuit and being adapted to enable said gating means at predetermined time intervals.

3. The receiver as defined in claim 1 wherein said gating means includes a plurality of coincident gates, each being coupled between corresponding output means of said divider circuit and into corresponding amplifier stages.

4. The receiver as defined in claim 3 and further including a timing circuit coupled to said input circuit and adapted to simultaneously enable each said coincident gate at predetermined time intervals.

5. The receiver as defined in claim 4 wherein said timing means being a comparator detector.

6. A receiver for receiving transmitted radio signals comprising:

a delay line being adapted to receive said radio signals;

an amplifier means coupled in series with said delay line;

a differentiator means being adapted to receive said radio signals;

a voltage divider responsive to said differentiator and having a plurality of output means, said means being enabled at differing voltage levels;

gating means coupled to said voltage divider for coupling the output means thereof to said amplifier means.

7. The receiver as defined in claim 6 and further comprising timing means responsive to said differentiator for enabling said gating means at a time depending upon the starting time of the signal from said differentiator.

8. The receiver as defined in claim 7 wherein said gating means includes a plurality of coincident gates responsive to said voltage divider and said timing means.

9. The receiver as defined in claim 8 and further comprising level detecting means coupled between said coincident gates and the output means of said voltage divider.

10. In a receiver for receiving loran pulses, an automatic gain control circuit comprising:

an input buffer amplifier adapted to receive loran pulses; said buffer amplifier including an output circuit;

a delay line coupled to the output circuit of said buffer amplifier for delaying the loran pulse a predetermined time interval;

a plurality of amplifier stages coupled in series with said delay line;

a voltage divider coupled to the output circuit of said input buffer amplifier, said voltage divider having a plurality of output circuits each being enabled at different voltage levels on the input to said voltage divider;

a timing gate coupled to be responsive to the rise of the voltage on the input to said voltage divider; and gating means coupled between corresponding output circuits of said voltage dividers and corresponding ones of said plurality of amplifier stages, said gating means being enabled by said timing means.

11. In the receiver as defined in claim 10 the automatic gain control circuit further comprising differentiating means coupled between said input buffer amplifier and said voltage divider.

12. In the receiver as defined in claim 10 the automatic gain control circuit further comprising level detectors coupled between the output circuits of said voltage divider and said gating means.

13. In the receiver as defined in claim 10 the automatic gain control further comprising:

differentiating means coupled between said input buffer amplifier and said voltage divider; and level detectors coupled between the output circuits of said voltage divider and said gating means.